(12) United States Patent
Inagawa

(10) Patent No.: US 7,538,441 B2
(45) Date of Patent: *May 26, 2009

(54) CHIP WITH POWER AND SIGNAL PADS CONNECTED TO POWER AND SIGNAL LINES ON SUBSTRATE

(75) Inventor: Hideho Inagawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/765,185

(22) Filed: Jun. 19, 2007

(65) Prior Publication Data

US 2007/0235874 A1    Oct. 11, 2007

Related U.S. Application Data

(62) Division of application No. 11/061,438, filed on Feb. 22, 2005, now Pat. No. 7,259,467.

(30) Foreign Application Priority Data

Feb. 24, 2004  (JP) .............................. 2004-047408
Feb. 9, 2005   (JP) .............................. 2005-033018

(51) Int. Cl.
*H01L 23/48*   (2006.01)
*H01R 9/00*    (2006.01)

(52) U.S. Cl. .................. 257/784; 257/786; 361/772; 361/773; 361/777

(58) Field of Classification Search .............. None
See application file for complete search history.

(56) References Cited

U.S. PATENT DOCUMENTS 5,798,571 A    8/1998  Nakajima ............... 257/784

6,476,505 B2 *  11/2002  Nakamura ............... 257/786
6,727,597 B2 *  4/2004   Taylor et al. ............ 257/786
6,798,075 B2 *  9/2004   Liaw et al. .............. 257/784
7,259,467 B2 *  8/2007   Inagawa .................. 257/784
2001/0011768 A1  8/2001  Kohara et al. ............ 257/692

FOREIGN PATENT DOCUMENTS

JP    9-22977    1/1997
JP    11-87399   3/1999
JP    5-160333   6/2005

* cited by examiner

*Primary Examiner*—Alonzo Chambliss
(74) *Attorney, Agent, or Firm*—Fitzpatrick, Cella, Harper & Scinto

(57) ABSTRACT

A semiconductor integrated circuit device is provided which comprises a semiconductor chip having wire bonding pads and a package encapsulating the semiconductor chip and connected via bonding wires to the wire bonding pads, wherein wire bonding pads on the semiconductor chip are arranged in two rows in a staggered manner along a periphery of the semiconductor chip, and of the wire bonding pads, power supply pads are arranged in a rear row located close to a semiconductor integrated circuit unit as an active area on the semiconductor chip and in a front row, only signal pads are arranged. Because the power supply pads are provided in the rear row, the line width of a power supply line led out from each power supply pad can be made equal to the width of the pad, thus reducing the impedance of the connection circuit between the semiconductor chip and the package, and suppressing generation of radiation noise, ground bounce and so on.

12 Claims, 6 Drawing Sheets

CHIP WITH POWER AND SIGNAL PADS CONNECTED TO POWER AND SIGNAL LINES ON SUBSTRATE

CROSS REFERENCE TO RELATED APPLICATION

This application is a Divisional of U.S. application Ser. No. 11/061,438, filed Feb. 22, 2005, the entire disclosure of which is incorporated by reference herein.

BACKGROUND OF THE INVENTION

1. Field of the Invention

The present invention relates to a semiconductor integrated circuit device (IC package) having a semiconductor chip encapsulated with a package comprised of a resin and being capable of suppressing radiation noise or ground bounce noise caused by a connection wiring structure between the semiconductor chip and the package.

2. Related Background Art

In recent years, with the progress of semiconductor fine processing technology involving further enlargement of circuit scale, the adverse affect of radiation noise or ground bounce noise generated from a semiconductor integrated circuit device (IC) on other electronic devices and malfunction of a circuit itself has become a large problem.

The radiation noise or ground bounce noise is caused by the fact that when an internal circuit of an IC operates, a large current flows through a path of a power terminal of a bypass capacitor→a power line of a printed wiring board→a power line of a package→a power line of a semiconductor chip→an internal load (semiconductor integrated circuit unit) →a ground line of the semiconductor chip→a ground line of the package→a ground line of the printed wiring board→a ground terminal of the bypass capacitor. Specifically, due to an inductance component of the path, a potential variation occurs which is expressed by an equation: $\Delta V = -L \cdot di/dt$, where $\Delta V$ is an amount of the potential variation, L is an inductance value, and di/dt is an amount of current variation per unit time. This potential variation directly works as ground bounce to thereby cause malfunction of the circuit, or propagates directly to a main power wiring on the printed wring board or to a signal input/output line (signal line) of the IC to be radiated as radiation noise.

Accordingly, in order to suppress the radiation noise, making the impedance of the current path extending from the bypass capacitor to the semiconductor chip as small as possible is a very important subject. With regard to this subject, Japanese Patent Application Laid-Open Nos. H05-160333 and H09-22977 disclose that power supply lines (ground line and power line) of a package connected to a plurality of electrode pads for wire bonding (wire bonding pads) are made common to each other and led out with a large width.

Further, with the progress of semiconductor fine processing technology involving further enlargement of circuit scale, the size of an outer peripheral region of a semiconductor chip having wire bonding pads disposed therein becomes smaller, and at the same time the number of electrode pads becomes larger. Consequently, there has been adopted a structure in which wire bonding pads are arranged in two rows in a staggered (or zigzag) manner, instead of the arrangement in a single row adopted in the prior art. Japanese Patent Application Laid-Open No. H11-87399 discloses that in this staggered arrangement, for the purpose of stabilizing the characteristic impedance of a signal line and securing power supply to the circuit, a signal pad and a power supply pad (power pad and ground pad) are disposed as one set.

FIG. 7 shows a conventional example, and is a plan view showing the inside of an IC. Wire bonding pads 112 on a semiconductor chip 111 are disposed in two rows in a staggered manner. Of the wire bonding pads 112, wire bonding pads 112a are assigned to a front row that is located less inside of the semiconductor chip 111, and wire bonding pads 112b are assigned to a rear row that is located more inside of the semiconductor chip 111. Lines 113a from the wire bonding pads 112a of the front row, and lines 113b from the wire bonding pads 112b of the rear row are connected to a semiconductor integrated circuit unit (not shown) disposed inside the semiconductor chip 111. In this case, the lines 113a are disposed so as to pass between the wire bonding pads 112b of the rear row. The wire bonding pads 112a and 112b are used as signal pads or power supply pads.

Similarly, wire bonding pads 116 on a package 115 connected via bonding wires 114 to the semiconductor chip 111 are also disposed in two rows in a staggered manner. Of the wire bonding pads 116, wire bonding pads 116a are assigned to a rear row that is located more inside of the package 115, and wire bonding pads 116b are assigned to a front row that is located less inside of the package 115. Lines 117a from the wire bonding pads 116a of the rear row, and lines 117b from the wire bonding pads 116b of the front row are connected to lead pins or BGA ball lands (not shown) used to connect to the outside of the package 115. In this case, the lines 117b are disposed so as to pass between the wire bonding pads 116a in the rear row. The wire bonding pads 116a and 116b are used as signal pads or power supply pads.

However, in such an IC as shown in FIG. 7, when wire bonding pads 112a assigned to the front row located outside of the rear row are used as power supply pads, a power supply line 113a must pass between two signal pads 112b. Thus, the line width of the power supply line of the package cannot exceed the distance between two power supply pads 112b. Similarly, when wire bonding pads 116b assigned to the front row located outside of the rear row of the package 115 are used as power supply pads, the line width of the power supply line 117b cannot exceed the distance between two power supply pads 116a. Accordingly, the impedance of the power supply lines 113a and 117b cannot be lowered, thus restricting the reduction of impedance of the current path of the entire IC. Consequently, there has been posed a problem that much radiation noise and ground bounce noise will be generated.

SUMMARY OF THE INVENTION

It is, therefore, an object of the present invention to provide a semiconductor integrated circuit device comprising therein a highly integrated semiconductor chip and having wire bonding pads arranged in at least two rows in a staggered manner, which semiconductor integrated circuit device can significantly contribute to reduction of impedance for an entire power supply path, and to reduction in size of a package.

In order to achieve the above object, the present invention provides a semiconductor integrated circuit device comprising:

a semiconductor chip having wire bonding pads arranged at a periphery of a semiconductor integrated circuit unit; and a package encapsulating the semiconductor chip and having lines connected via bonding wires to the wire bonding pads, wherein the wire bonding pads comprise signal pads and power supply pads, and are arranged in a plurality of rows along the periphery of the semiconductor chip, and power supply pads of the wire bonding pads for supplying power to the semiconductor integrated circuit unit are disposed in an innermost of the plurality of rows.

Further, the present invention provides a semiconductor integrated circuit device characterized in that a power supply line led out from a power supply pad provided on the semiconductor chip has a width (or thickness) not less than a width (or thickness) of the power supply pad.

Moreover, the present invention provides a semiconductor integrated circuit device characterized in that the package has second wire bonding pads arranged therein which are connected via the bonding wires to the first wire bonding pads, wherein the second wire bonding pads comprise signal pads and power supply pads, and are arranged in a plurality of rows along a periphery of the package, and those power supply pads of the second wire bonding pads for supplying power to the semiconductor chip are disposed in the innermost row of the plurality of rows.

Further, the present invention provides a semiconductor integrated circuit device characterized in that the package is a BGA package having a plurality of rows of ball lands, the plurality of rows of ball lands comprise power supply lands connected via power supply lines to the power supply pads and signal lands connected via signal lines to the signal pads, and the power supply lands are disposed in one of the plurality rows that is located closest to the power supply pads.

The above and other objects of the present invention will become more apparent from the following description taken in conjunction with the accompanying drawings.

DESCRIPTION OF THE PREFERRED EMBODIMENTS

Preferred embodiments of the invention will now be described with reference to the drawings.

Example 1

Figure 1A:
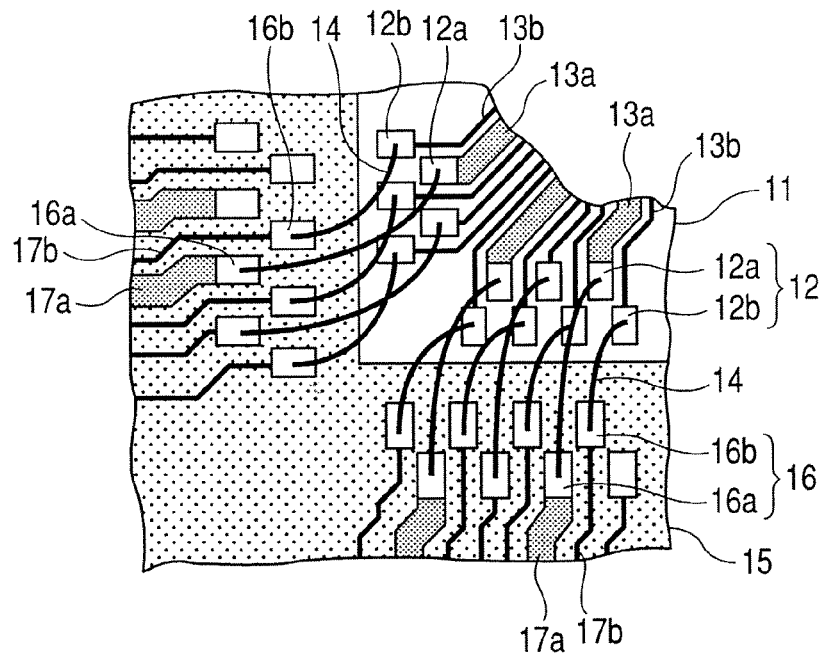
FIGS. 1A and 1B are plan views showing the inside of an IC according to Example 1 of the invention.

FIG. 1A is a plan view showing the inside of an IC according to Example 1 of the invention. Wire bonding pads 12 on a semiconductor chip 11 are disposed in two rows in a staggered manner. Of the wire bonding pads 12, power supply pads 12a (power pad and ground pad) are all assigned to the wire bonding pads in a rear row that is located more inside of the semiconductor chip 11. On the other hand, of the wire bonding pads 12, signal pads 12b may be assigned to any of the wire bonding pads. Power supply lines 13a from the power supply pads 12a, and signal lines 13b from the signal pads 12b are connected to a semiconductor integrated circuit unit (not shown) disposed inside the semiconductor chip 11. In this case, the line width of the power supply lines 13a thus disposed is equal to or larger than the width of the power supply pads 12a. The power supply lines 13a from the power supply pads 12a disposed at the rear row that is located more inside of the semiconductor chip 11 are not restricted by the other of the wire bonding pads 12 and can therefore have such a large line width.

Wire bonding pads 16 on package 15 connected via bonding lines 14 to the semiconductor chip 11 are also disposed in two rows in a staggered manner. Similarly to the case of the semiconductor chip 11, of the wire bonding pads 16, power supply pads 16a (power pad and ground pad) are all assigned to the wire bonding pads in a rear row that is located more inside of the package 15. On the other hand, of the wire bonding pads 16, signal pads 16b may be assigned to any of the wire bonding pads. Power supply lines 17a from the power supply pads 16a, and signal lines 17b from the signal pads 16b are connected to lead pins or BGA ball lands (not shown) used to connect to the outside of the package 15. In this case, the line width of the power supply lines 17a thus disposed is equal to or larger than the width of the power supply pads 16a. The power supply lines 17a from the power supply pads 16a disposed at the rear row that is located more inside of the package 15 are not restricted by the other of the wire bonding pads 16 and can therefore have such a large line width.

In this way, the impedance of the power supply lines 13a and 17a can be reduced, thereby lowering the impedance of a current path for the entire IC. Specifically, by making as large as possible the width of a power supply line extending from a bypass capacitor installed on a printed wiring board having a package of a semiconductor integrated circuit device mounted thereon to a semiconductor integrated circuit unit (active area) in a semiconductor integrated circuit device and effecting electrical connection thereof, it is possible to make the electrical connection impedance of the power supply line as small as possible, thus reducing the potential variation caused by a current component flowing through the power supply line to thereby prevent effectively troubles associated with radiation noise or ground bounce.

Figure 1B:
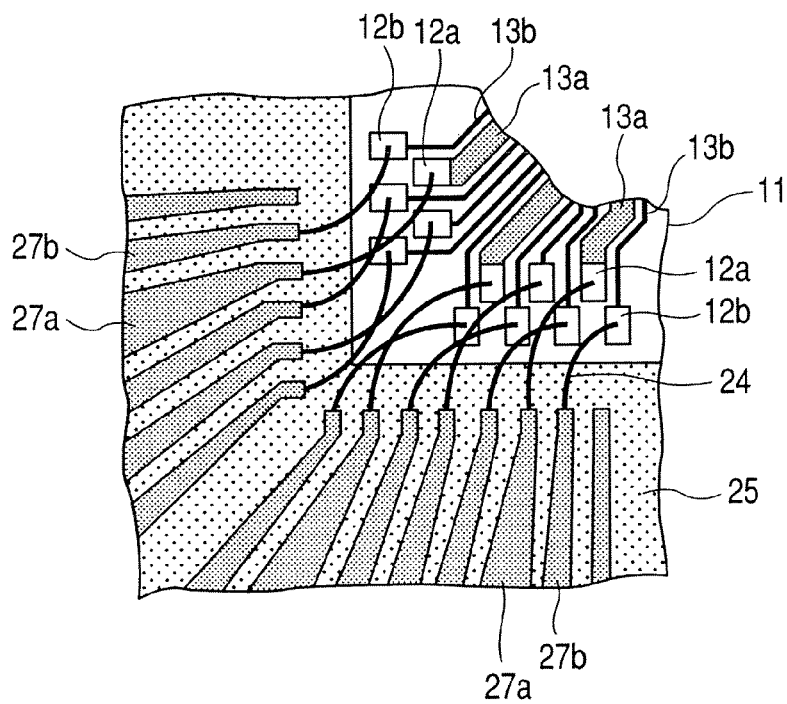

In the example shown in FIG. 1A, the wire bonding pads 12 are arranged in two rows in a staggered manner both in the semiconductor chip 11 and the package 15. According to the present invention, the wire bonding pads 12 do not always have to be disposed in two rows in a staggered manner both in the semiconductor chip 11 and the package 15, but may be disposed only in either one thereof. FIG. 1B is a plan view showing the inside of an IC in which wire bonding pads are disposed in two rows in a staggered manner only in the semiconductor chip 11.

Referring to FIG. 1B, the semiconductor chip 11 is similar in structure to the one shown in FIG. 1A. Thus the same reference numerals are applied to parts corresponding to those in FIG. 1A, and an explanation thereof is omitted. On package 25, there are assigned power supply lines 27a and signal lines 27b, both of which are formed by extending lead pins. Further, the power supply lines 27a and signal lines 27b also serve as wire bonding pads of the package 25, and are connected via bonding wires 24 to wire bonding pads 12a and 12b on the semiconductor chip 11. In this case, the line width of the power supply lines 27a can be made as large as possible to effectively lower the impedance of the current path for the entire IC.

Example 2

Figure 2:
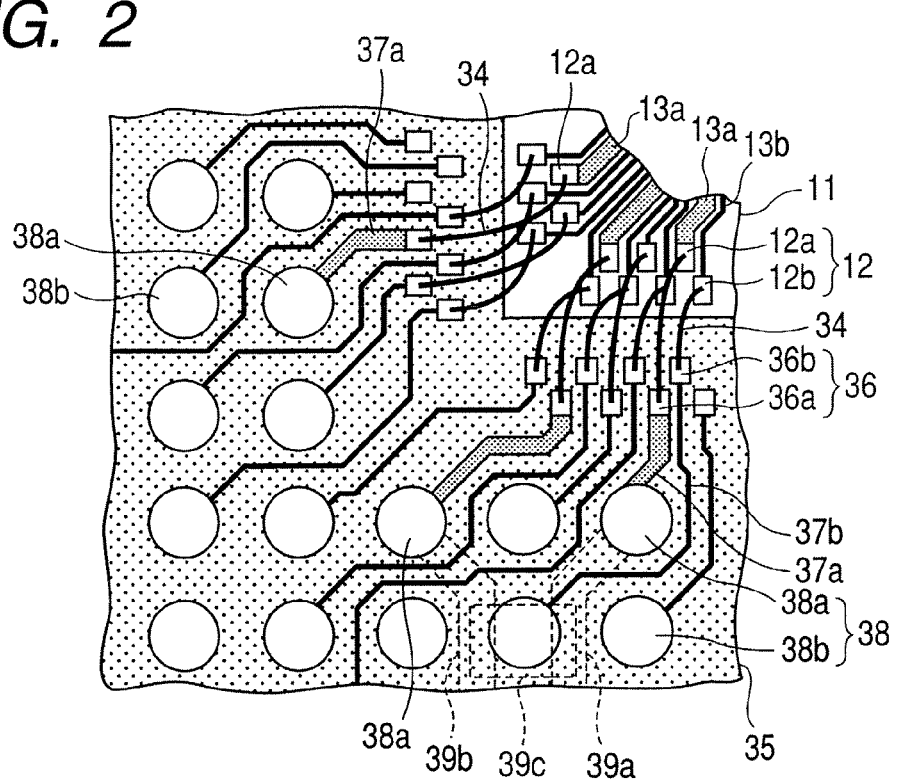
FIG. 2 is a plan view showing the inside of an IC according to Example 2 of the invention.

FIG. 2 is a plan view showing the inside of an IC according to Example 2 of the invention. FIG. 2 shows a case where the package is a BGA (Ball Grid Array). Referring to FIG. 2, the semiconductor chip 11 has a structure similar to the one shown in FIG. 1A. Thus, the same reference numerals are applied to parts corresponding to those in FIG. 1A, and an explanation thereof is omitted.

In FIG. 2, similarly to Example 1 shown in FIG. 1A, wire bonding pads 36 on package 35 are disposed in two rows in a staggered manner. Of the wire bonding pads 36, power supply pads 36a are all disposed in a rear row that is located more inside of the package 35, and in a front row that is located less inside of the package 35, there are deposed only signal pads 36b. Wire bonding pads 12 on the semiconductor chip 11 are connected via bonding wires 34 to the wire bonding pads 36 on the package 35. With this arrangement, power supply lines 37a each have a large line width led out from the wire bonding pads 36 do not pass between signal lands 38b, and therefore the line width of the power supply lines 37a can be increased so as to be equal to the width of the power supply pads 36a.

Further, of the BGA ball lands 38, the power supply lands 38a, which are power lands or ground lands, are disposed in a row located closest to the wire bonding pads 36. Accordingly, the power supply lines 37a having a large line width (as compared to the widths of signal lines 37b) led out from the wire bonding pads 36 can be connected to the power supply lands 38a with the smallest length.

Indicated by dashed lines in FIG. 2 are a power line 39a, a ground line 39b, and a bypass capacitor 39c mounted therebetween. The power line 39a is electrically connected via a ball to a power supply land 38a (power land), and the ground line 39b is electrically connected via a ball to a power supply land 38a (ground land). With this configuration, it is possible to make as low as possible the impedance of the entire current path extending from the bypass capacitor to the semiconductor integrated circuit mounted on the printed wiring board.

With the configuration shown in Example 2, even when the package is a BGA, the lowering in impedance of the current path for the entire IC can be achieved.

Example 3

Figure 3:
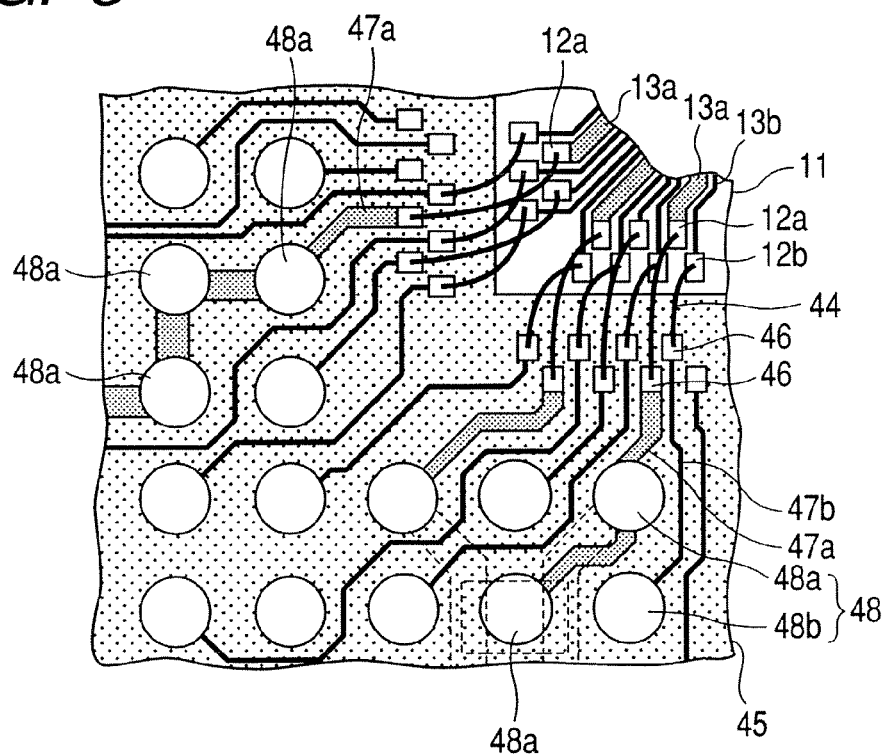
FIG. 3 is a plan view showing the inside of an IC according to Example 3 of the invention.

FIG. 3 is a plan view showing the inside of an IC according to Example 3 of the invention, in which the package is a BGA. Referring to FIG. 3, the semiconductor chip 11 has a structure similar to the one shown in FIG. 1A. Thus, the same reference numerals are applied to parts corresponding to those in FIG. 1A, and an explanation thereof is omitted.

As shown in FIG. 3, the total number of BGA ball lands 48 provided in a package 45, including power supply lands 48a and signal lands 48b used to connect to the printed wiring board, is larger than the total number of wire bonding pads 46 used as power supply pad or signal pad. Wire bonding pads 12 on the semiconductor chip 11 are connected via bonding lines 44 to the wire bonding pads 46 on the package 45. A plurality of power supply lands 48a are connected in series to a single power supply line 47a having a large line width (as compared to a line width of signal lines 47b) led out from the wire bonding pad 46. Accordingly, the impedance of the electrical connection between the package 45 and the printed wiring board can be lowered.

Example 4

Figure 4:
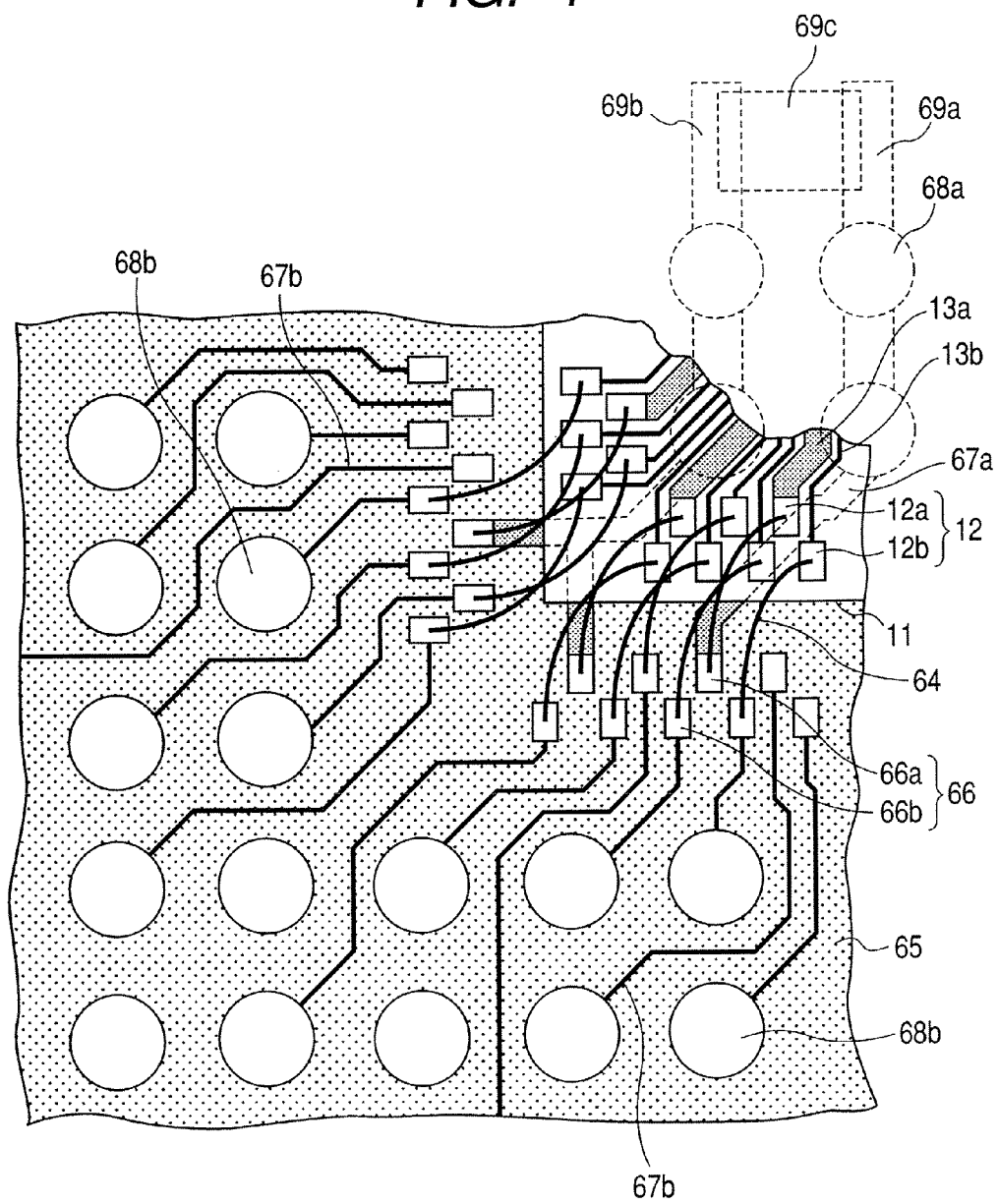
FIG. 4 is a plan view showing the inside of an IC according to Example 4 of the invention.

FIG. 4 is a plan view showing the inside of an IC according to Example 4 of the invention. Referring to FIG. 2, in Example 2, both the power supply land 38a and signal land 38b are disposed outside the semiconductor chip 11. On the contrary, in Example 4, there is shown a case where power supply lands 38a are disposed inside the semiconductor chip 11. In FIG. 4, the same reference numerals are applied to members corresponding to those in FIG. 2, and an explanation thereof is omitted.

In FIG. 4, similarly to FIG. 2, wire bonding pads 66 on package 65 are disposed in two rows in a staggered manner. Of the wire bonding pads 66, all power supply pads 66a are disposed in a front row that is located less inside of a package 65. In a rear row that is located more inside of the package 65, there are disposed only signal pads 66b. Wire bonding pads 12 on the semiconductor chip 11 and the wire bonding pads 66 on the package 65 are connected to each other via bonding wires 64. In this case, of BGA ball lands power supply lands 68a as power lands or ground lands are disposed under the semiconductor chip 11, as illustrated by dotted lines. Signal lands 68b are disposed outside the semiconductor chip 11. Thus, power supply lines 67a having a large line width from the power supply pads 66a extend toward the inside of the semiconductor chip 11 and connected to the power supply lands 68a. Further, signal lines 67b having a small line width from the signal pads 66b extend toward the outside of the semiconductor chip 11 and connected to the signal lands 68b. Incidentally, power lines 69a extend from the power supply lands 68a; ground lines 69b extend from the signal lands 68b; and between the power lines 69a and the signal lands 68b, there is mounted a bypass capacitor 69c.

With this arrangement, the power supply lines 67a each having a large line width led out from the wire bonding pads 66 do not pass between the signal lands 68b, and therefore the line width of the power supply lines 67a can be increased so as to be equal to the width of the power supply pads 66a. Accordingly, the lowering in impedance of the current path for the entire IC can be achieved. Incidentally, referring to FIG. 4, although all the power supply lands 68a are disposed under the semiconductor chip 11, the present invention is not limited thereto. According to the example, all the power supply pads 66a connected to the power supply lands 68a arranged under the semiconductor chip 11 are disposed in the front row that is located less inside of the package 65, while all the signal pads 66b connected to the signal lands 68b arranged outside the semiconductor chip 11 are disposed in the rear row that is located more inside of the package.

Example 5

Figure 5:
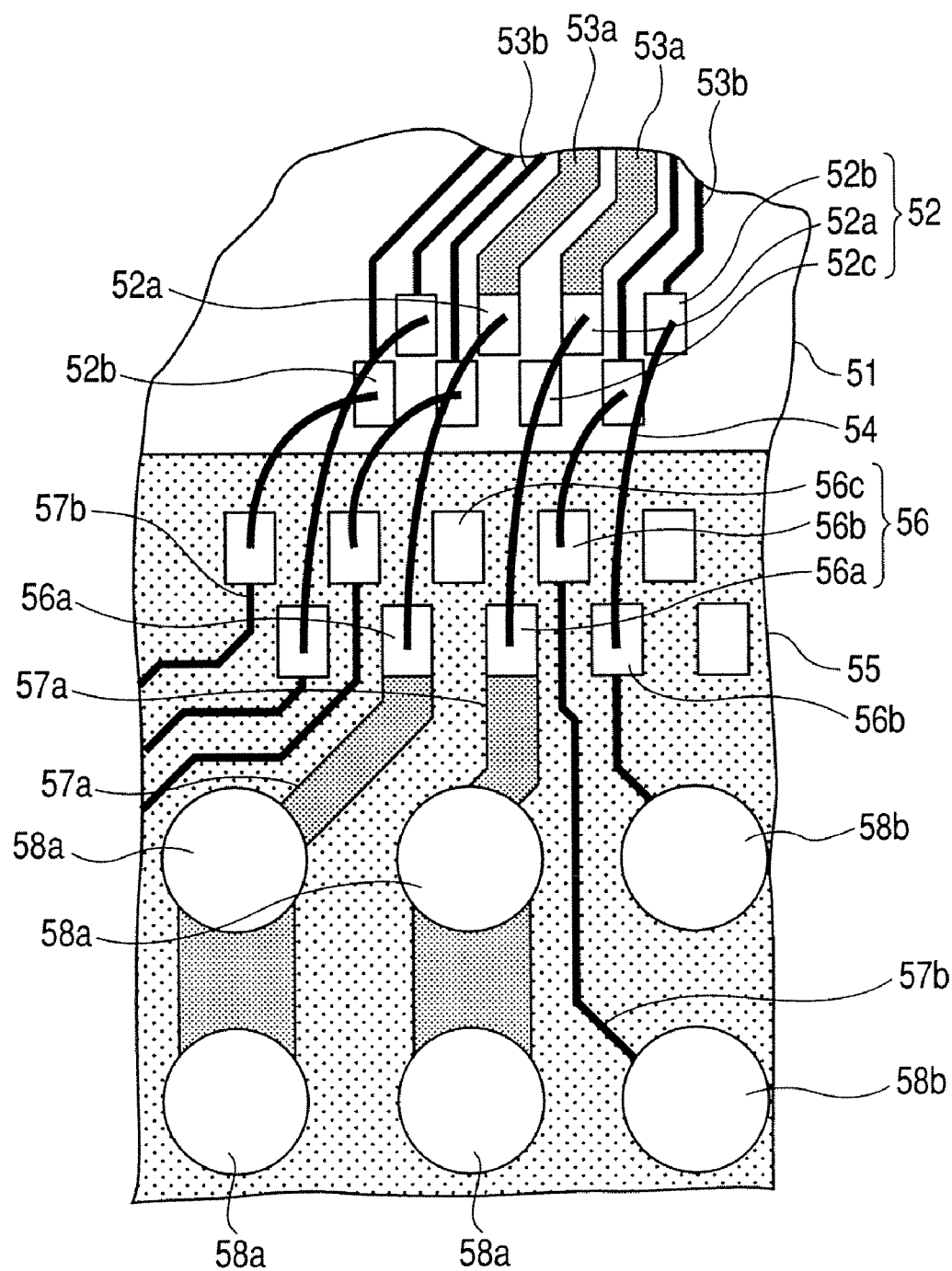
FIG. 5 is a plan view showing the inside of an IC according to Example 5 of the invention.

FIG. 5 is a plan view showing the inside of an IC according to Example 5 of the invention, in which the package is a BGA. Wire bonding pads 52 on semiconductor chip 51 are disposed in two rows in a staggered manner. Of the wire bonding pads 52, power supply pads 52a are all assigned to the wire bonding pads in a rear row that is located more inside of the semiconductor chip 51. Further, of the wire bonding pads 52, signal pads 52b can be assigned to any of the wire bonding pads. An NC pad 52c is assigned to a front row that is located less inside of the semiconductor chip 51 between two adjacent power supply pads 52a.

Power supply lines 53a from the power supply pads 52a, and signal lines 53b from the signal pads 52b are connected to a semiconductor integrated circuit unit (not shown) disposed inside the semiconductor chip 51. In this case, the power supply lines 53a thus disposed have a line width equal to or larger than the width of the power supply pads 52a. No line from the NC pad 52c is provided.

Similarly, wire bonding pads 56 on a package 55, which are connected via bonding lines 54 to the semiconductor chip 51, are also disposed in two rows in a staggered manner. Of the wire bonding pads 56, power supply pads 56a are all assigned to the wire bonding pads in a rear row that is located more inside of the package 55. Further, of the wire bonding pads 56, signal pads 56b can be assigned to any of the wire bonding pads. Moreover, an NC pad 56c is assigned to a front row that is located less inside than the rear row of the package of the package 55 between two adjacent power supply pads 56a.

Power supply lines 57a from the power supply pads 56a are connected to power supply lands 58a. Further, signal lines 57b from the signal pads 56b are connected to signal lands 58b. In this case, the power supply lines 57a thus disposed have a line width equal to or larger than the width of the power supply pads 56a. No line from the NC pad 56c is provided.

With this configuration, any signal line 53b is not disposed between two power supply lines 53a on the semiconductor chip 51, and therefore the coupling between the two power supply lines 53a is increased, thus enabling low impedance wiring and connection. Similarly, any signal line 57b is not disposed between two power supply lines 57a on the package 55, and therefore the coupling between the two power supply lines 57a is increased, thus enabling further low impedance wiring and connection.

Example 6

Figure 6:
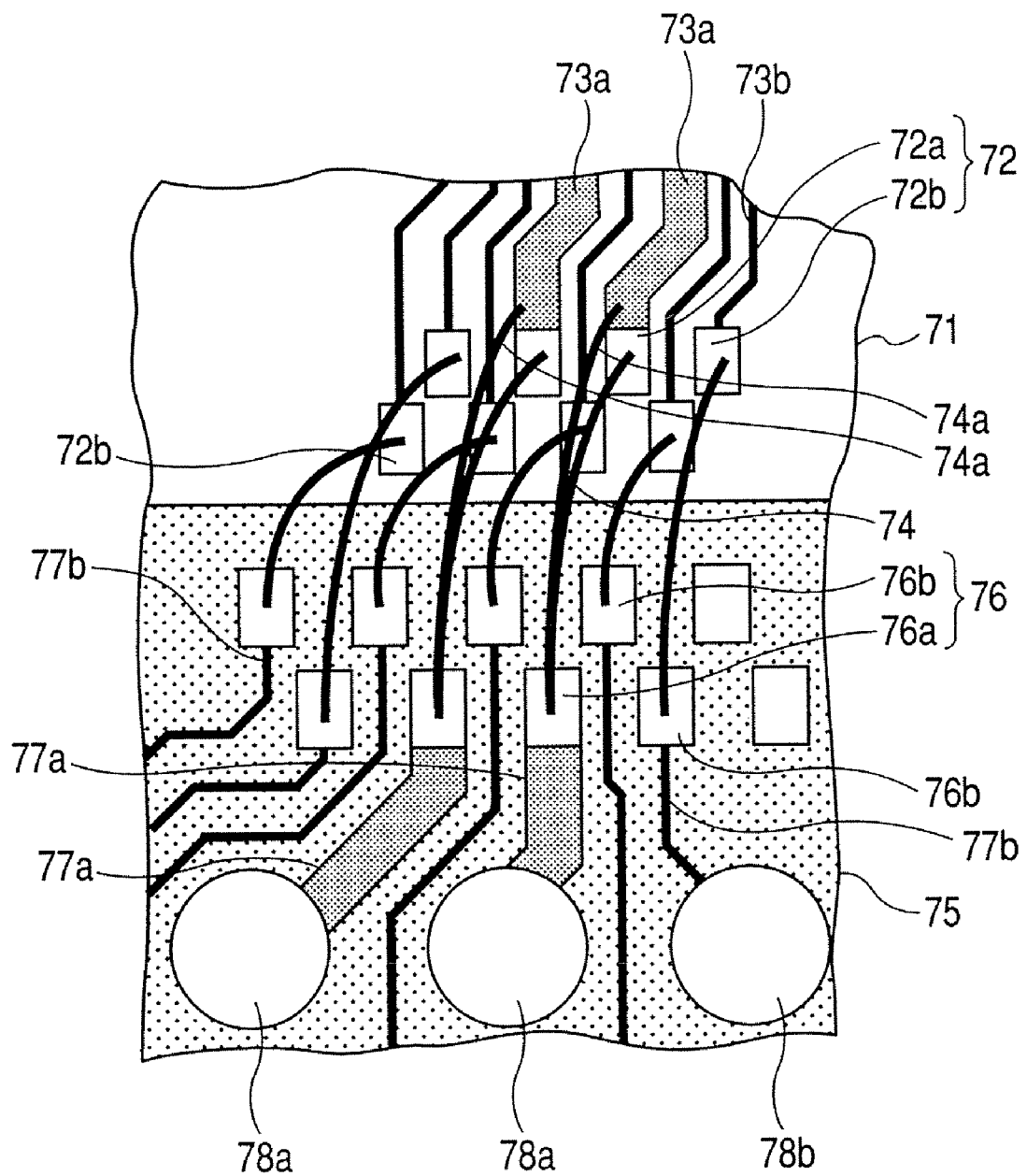
FIG. 6 is a plan view showing the inside of an IC according to Example 6 of the invention.
Figure 7:
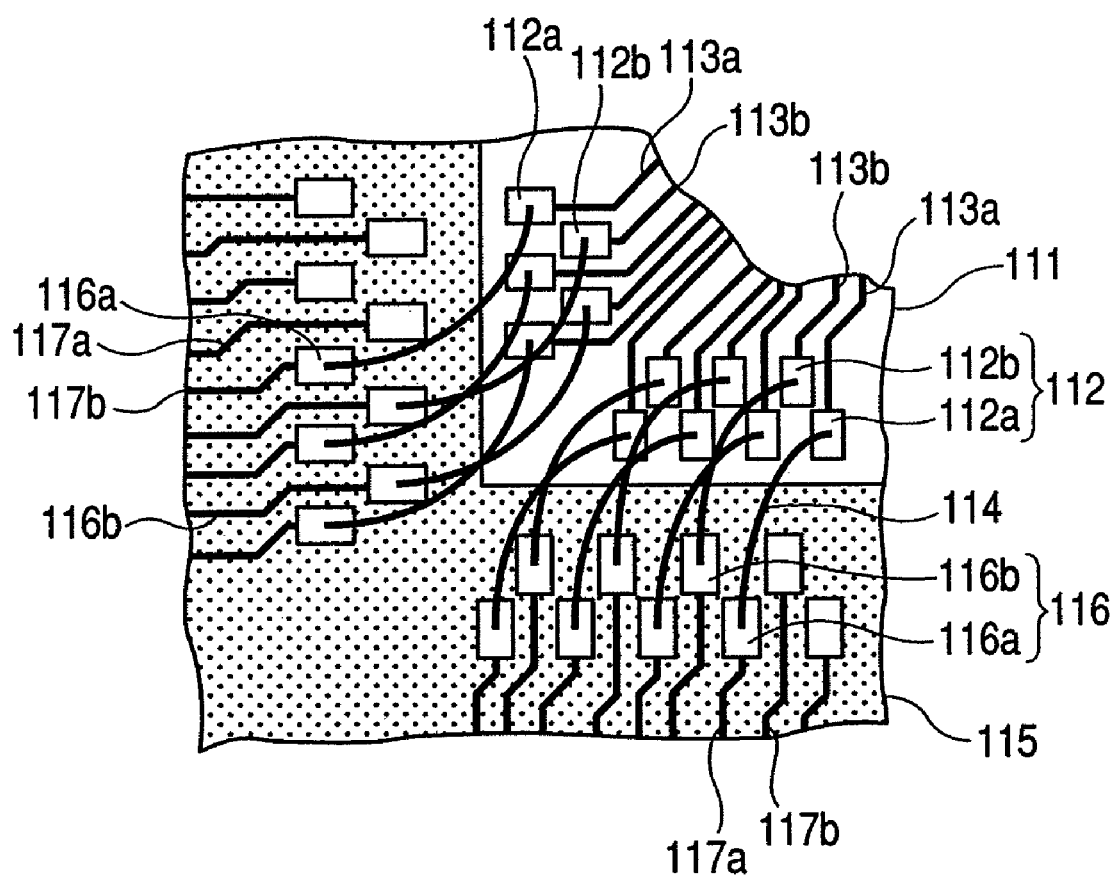
FIG. 7 is a plan view showing the inside of an IC according to the prior art.

FIG. 6 is a plan view showing the inside of an IC according to Example 6 of the invention, in which the package is a BGA. Wire bonding pads 72 on a semiconductor chip 71 are disposed in two rows in a staggered manner. Of the wire bonding pads 72, power supply pads 72a are all assigned to the wire bonding pads in a rear row that is located more inside of the semiconductor chip 71. Also, of the wire bonding pads 72, signal pads 72b may be assigned to any of the wire bonding pads.

Power supply lines 73a from the power supply pads 72a, and signal lines 73b from the signal pads 72b are connected to a semiconductor integrated circuit unit (not shown) disposed inside the semiconductor chip 71. In this case, the power supply lines 73a thus disposed each have a line width equal to or larger than the width of the power supply pad 72a.

Similarly, wire bonding pads 76 on a package 75 are disposed in two rows in a staggered manner. Of the wire bonding pads 76, power supply pads 76a are all assigned to the wire bonding pads in a rear row that is located more inside of the package 55. Further, of the wire bonding pads 76, signal pads 76b may be assigned to any of the wire bonding pads.

Power supply lines 77a from the power supply pads 76a are connected to power supply lands 78a. Further, signal lines 77b from the signal pads 76b are connected to signal lands 78b. In this case, the power supply lines 77a thus disposed each have a line width equal to or larger than the width of the power supply pads 76a.

The connection between the power supply pads 72a on the semiconductor chip 71 and the power supply pads 76a on the package 75, and the connection between the signal pads 72b on the semiconductor chip 71 and the signal pads 76b on the package 75 are performed with bonding lines 74. Also, the power supply lines 73a on the semiconductor chip 71 and the power supply pads 76a on the package 75 are connected via bonding lines 74a. This configuration is attained by making large the line width of the power supply lines 73. Similarly, the power lines 77a on the package 75 and the power supply pads 72a on the semiconductor chip 71 may be connected via the bonding lines 74a.

With this configuration, the impedance of the connection between the power supply lines 73a on the semiconductor chip 71 and the power supply lines 77a on the package 75 can further be lowered.

The invention can be applied widely to a driving IC for driving a liquid-jet head mounted on a laser printer or the like, or to a driving unit of various kinds of optical devices.

Of wire bonding pads disposed in at least two rows in a staggered manner on a semiconductor chip, power pads and ground pads for power supply (power supply pads) are disposed in a rear row that is located more inside of the semiconductor chip, so that power lines and ground lines on the semiconductor chip led out from wire bonding pads do not pass between wire bonding pads disposed in a front row that is located less inside than the rear row of the semiconductor chip. Accordingly, electrical connection to a semiconductor integrated circuit unit disposed inside the semiconductor chip can be performed by use of wide lines. This makes it possible to reduce the impedance of the power supply path extending from the wire bonding pads on the semiconductor chip to the semiconductor integrated circuit unit.

Further, of wire bonding pads disposed in at least two rows in a staggered manner on a package, power pads and ground pads are disposed in a rear row that is located more inside of the semiconductor package and distant from the wire bonding connecting end. In this state, power lines and ground lines led out from wire bonding pads do not pass between wire bonding pads disposed in a front row that is located less inside than the rear row, so that electrical connection to lead pins or BGA ball lands being in contact with a printed wiring board can be performed by use of wide lines. This makes it possible to reduce the impedance of the power supply path extending from the wire bonding pads on the package to lines of the semiconductor chip.

Incidentally, ICs of a lead type such as SOP, QFP or the like include ones in which a package has no line disposed thereon and lines are bonded directly to lead pins. In this case, the above-described low-impedance connection can be applied to lines on a semiconductor chip.

This application claims priorities from Japanese Patent Application Nos. 2004-047408 filed on Feb. 24, 2004 and 2005-033018 filed on Feb. 9, 2005, which are hereby incorporated by reference herein.

What is claimed is:

1. A semiconductor integrated circuit device comprising:
   a semiconductor chip having wire bonding pads arranged at a periphery of a semiconductor integrated circuit unit; and
   a package encapsulating the semiconductor chip and having lines connected via bonding wires to the wire bonding pads,
   wherein the wire bonding pads comprise signal pads and power supply pads, and are arranged in a plurality of rows along the periphery of the semiconductor chip,
   wherein all of the power supply pads of the wire bonding pads are for supplying power to the semiconductor integrated circuit unit and are disposed in an innermost area of the plurality of rows, and
   wherein power supply lines are led out from the respective power supply pads, and have widths not less than widths of the power supply pads.

2. The semiconductor integrated circuit device according to claim 1, wherein the power supply lines are connected via bonding lines to the power supply pads and the signal lines are connected via bonding lines to the signal pads.

3. The semiconductor integrated circuit device according to claim 1, wherein the wire bonding pads are arranged in the plurality of rows in a staggered manner.

4. A semiconductor integrated circuit device comprising:
a semiconductor chip having first wire bonding pads arranged at a periphery of a semiconductor integrated circuit unit; and
a package encapsulating the semiconductor chip and having second wire bonding pads connected via bonding wires to the wire bonding pads,
wherein the first wire bonding pads comprise first signal pads and first power supply pads, and are arranged in a plurality of rows along a periphery of the semiconductor chip, and all of the first power supply pads of the first wire bonding pads are for supplying power to the semiconductor integrated circuit unit and are disposed in an innermost area of the plurality of rows,
wherein power supply lines are led out from the respective first power supply pads, and have widths not less than widths of the first power supply pads,
and wherein the second wire bonding pads comprise second signal pads and second power supply pads, and are arranged in a plurality of rows along a periphery of the package, and all of the second power supply pads of the second wire bonding pads are for supplying power to the semiconductor chip are disposed in an innermost area of the plurality of rows,
wherein power supply lines are led out from the respective second power supply pads, and have widths not less than widths of the second power supply pads.

5. The semiconductor integrated circuit device according to claim 4, wherein the package is a BGA package having a plurality of rows of ball lands, the plurality of rows of ball lands comprise power supply lands connected via the power supply lines to the power supply pads and signal lands connected via signal lines to the signal pads, and the power supply lands are disposed in one of the plurality rows that is located closest to the power supply pads.

6. The semiconductor integrated circuit device according to claim 4, wherein the package is a BGA package having a plurality of rows of ball lands, the plurality of rows of ball lands comprise power supply lands connected via the power supply lines to the power supply pads and signal lands connected via signal lines to the signal pads; the power supply pads are connected to those power supply lands disposed in that row of the plurality of rows which is located closest to the power supply pads; and power supply lands other than those power supply lands disposed in the row located closest to the power supply pads are connected to those power supply lands disposed in the row located closest to the power supply pads.

7. The semiconductor integrated circuit device according to claim 4, wherein the first and second wire bonding pads are arranged, respectively, in the plurality of rows in a staggered manner.

8. The semiconductor integrated circuit device according to claim 7, wherein the power supply pads on the semiconductor chip are disposed adjacent to each other, and an outer edge of an NC pad not connected to any line is disposed outwardly with respect to an outer edge of the power supply pads of the semiconductor chip between two adjacent power supply pads.

9. The semiconductor integrated circuit device according to claim 7, wherein the power supply pads on the package are disposed adjacent to each other, and an outer edge of an NC pad not connected to any line is disposed outwardly with respect to an outer edge of the power supply pads of the package between two adjacent power supply pads.

10. The semiconductor integrated circuit device according to claim 4, wherein the second power supply pads on the package are connected via bonding wires to their respective power supply lines on the semiconductor chip.

11. A semiconductor integrated circuit device comprising:
a semiconductor chip having first wire bonding pads arranged at a periphery of a semiconductor integrated circuit unit; and
a package encapsulating the semiconductor chip and having second wire bonding pads connected via bonding wires to the wire bonding pads of the semiconductor chip,
wherein the package is a BGA package having a plurality of rows of ball lands, the plurality of rows of ball lands comprise power supply lands connected via power supply lines to the power supply pads and signal lands connected via signal wires to the signal pads, and at least one of the power supply lands is disposed under the semiconductor chip,
wherein the first wire bonding pads comprise first signal pads and first power supply pads and are arranged in a plurality of rows along a periphery of the semiconductor chip, and all of the first power supply pads of the first wire bonding pads are for supplying power to the semiconductor integrated circuit unit and are disposed in an innermost area of the plurality of rows,
and wherein the second wire bonding pads comprise second signal pads and second power supply pads and are arranged in a plurality of rows along a periphery of the package, and all of the second power supply pads of the second wire bonding pads are connected to power supply lands disposed under the semiconductor chip by power supply lines, and all of the second power supply pads connected to power supply lands disposed outside the semiconductor chip are disposed in the innermost area of the plurality of rows.

12. The semiconductor integrated circuit device according to claim 11, wherein the first and second wire bonding pads are arranged, respectively, in the plurality of rows in a staggered manner.

* * * * *